US010128081B2

(12) United States Patent
Nomaguchi et al.

(10) Patent No.: US 10,128,081 B2
(45) Date of Patent: Nov. 13, 2018

(54) COMPOSITE CHARGED PARTICLE BEAM DETECTOR, CHARGED PARTICLE BEAM DEVICE, AND CHARGED PARTICLE BEAM DETECTOR

(71) Applicant: Hitachi High-Technologies Corporation, Minato-ku, Tokyo (JP)

(72) Inventors: Tsunenori Nomaguchi, Tokyo (JP); Toshihide Agemura, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/671,472

(22) Filed: Aug. 8, 2017

(65) Prior Publication Data

US 2017/0358421 A1    Dec. 14, 2017

Related U.S. Application Data

(62) Division of application No. 14/761,963, filed as application No. PCT/JP2014/050270 on Jan. 10, 2014, now Pat. No. 9,761,409.

(30) Foreign Application Priority Data

Jan. 31, 2013    (JP) .................................. 2013-016325

(51) Int. Cl.
*H01J 37/28* (2006.01)
*H01J 37/22* (2006.01)
(Continued)

(52) U.S. Cl.
CPC ................ *H01J 37/28* (2013.01); *G01T 1/20* (2013.01); *H01J 37/10* (2013.01); *H01J 37/147* (2013.01);
(Continued)

(58) Field of Classification Search
CPC .......... H01J 37/28; H01J 37/285; H01J 37/02; H01J 37/023; H01J 37/26; H01J 37/261; H01J 37/268
(Continued)

(56) References Cited

U.S. PATENT DOCUMENTS 4,820,977 A    4/1989  Brust
5,656,811 A    8/1997  Itoh et al.
(Continued)

FOREIGN PATENT DOCUMENTS

EP    0 464 917 A1    1/1992
JP    58-155380 A    9/1983
(Continued)

OTHER PUBLICATIONS

International Search Report dated Feb. 25, 2014 with English translation (four (4) pages).

*Primary Examiner* — Jason McCormack
(74) *Attorney, Agent, or Firm* — Crowell & Moring LLP (57) ABSTRACT

A composite charged particle beam apparatus modulates an irradiation condition of a charged particle beam at high speed and detects a signal in synchronization with a modulation period to extract a signal arising from a particular charged particle beam when a sample is irradiated with a plurality of charged particle beams simultaneously. Light emitted from two or more kinds of scintillators having different light emitting properties is dispersed, signal strength is detected, and a signal is processed based on a ratio of first signal strength when the sample is irradiated with a first charged particle beam alone to second signal strength when the sample is irradiated with a second charged particle beam alone. The apparatus can extract only a signal
(Continued)

arising from a desired charged particle beam even when the sample is irradiated with the plurality of charged particle beams simultaneously.

9 Claims, 9 Drawing Sheets

(51) Int. Cl.
  *H01J 37/244* (2006.01)
  *H01J 37/24* (2006.01)
  *G01T 1/20* (2006.01)
  *H01J 37/10* (2006.01)
  *H01J 37/147* (2006.01)
  *H01J 37/30* (2006.01)
  *H01J 37/317* (2006.01)

(52) U.S. Cl.
  CPC .............. *H01J 37/22* (2013.01); *H01J 37/24* (2013.01); *H01J 37/244* (2013.01); *H01J 37/30* (2013.01); *H01J 37/3178* (2013.01)

(58) Field of Classification Search
  USPC .......... 250/310, 306, 307, 311, 492.1, 492.2
  See application file for complete search history.

(56) References Cited

U.S. PATENT DOCUMENTS

| | | |
|---|---|---|
| 6,066,849 A | 5/2000 | Masnaghetti et al. |
| 6,737,658 B1 | 5/2004 | Nakasugi et al. |
| 2004/0104353 A1 | 6/2004 | Berglund |
| 2005/0184251 A1 | 8/2005 | Oi et al. |
| 2005/0184252 A1 | 8/2005 | Ogawa et al. |
| 2006/0054817 A1 | 3/2006 | Parker |
| 2008/0308742 A1* | 12/2008 | Gerlach ................ H01J 37/244 250/397 |
| 2009/0039258 A1 | 2/2009 | Honda et al. |
| 2010/0320382 A1 | 12/2010 | Almogy et al. |
| 2012/0025075 A1 | 2/2012 | Moore et al. |
| 2013/0010100 A1 | 1/2013 | Kotaki et al. |
| 2014/0001360 A1* | 1/2014 | Kasai ................... H01J 37/244 250/307 |

FOREIGN PATENT DOCUMENTS

| | | |
|---|---|---|
| JP | 58-158848 A | 9/1983 |
| JP | 63-27033 A | 2/1988 |
| JP | 4-229939 A | 8/1992 |
| JP | 7-333120 A | 12/1995 |
| JP | 9-161712 A | 6/1997 |
| JP | 11-111210 | 4/1999 |
| JP | 2005-108545 A | 4/2005 |
| JP | 2005-243275 A | 9/2005 |
| JP | 2005-243368 A | 9/2005 |

* cited by examiner

Signal arising from ion beam ($I_{signal}$)

FIG. 3B

Signal arising from electron beam ($E_{signal}$)

FIG. 3C

Signal that is actually detected ($I_{signal}+E_{signal}$)

FIG. 3D

Signal after passing filter ($E_{signal}$)

Scan step of ion beam

Scan step of electron beam

Scan step of electron beam

Scan step of electron beam

Modulation period of radiated electron beam

FIG. 8A
Signal arising from ion beam ($I_1$ and $I_2$)

Scan step of ion beam

FIG. 8B
Signal arising from electron beam ($E_1$ and $E_2$)

Scan step of electron beam

FIG. 8C
Signal that is actually detected ($T_1$ and $T_2$)

Scan step of electron beam

↑
Signal and scan step of electron beam do not correspond

FIG. 8D
Signal after passing filter ($\alpha T_1 - T_2$)

Scan step of electron beam

↑
Signal and scan step of electron beam correspond, meaning signal arising from electron beam can be extracted

FIG. 9

COMPOSITE CHARGED PARTICLE BEAM DETECTOR, CHARGED PARTICLE BEAM DEVICE, AND CHARGED PARTICLE BEAM DETECTOR

CROSS REFERENCE TO RELATED APPLICATION

This application is a divisional of U.S. application Ser. No. 14/761,963, filed Jul. 20, 2015, which is a 371 of International Application No. PCT/JP2014/050270, filed Jan. 10, 2014, which claims priority from Japanese Patent Application No. 2013-016325, filed Jan. 31, 2013, the disclosures of which are expressly incorporated by reference herein.

TECHNICAL FIELD

The present invention relates to a charged particle beam apparatus including a mechanism that irradiates a sample with a charged particle beam and a mechanism that detects a charged particle emitted from the sample.

BACKGROUND ART

An FIB-SEM system is equipped with a focused ion beam (FIB) capable of performing nano-level processing and a scanning electron microscope (SEM) capable of performing nano-level observation, and is used in various fields such as semiconductor, materials, and biotechnology fields. The most striking feature of the FIB-SEM system is that a cross section processed by the FIB can be observed by the SEM on the spot. This allows the FIB processing to be controlled with high precision. When performing a failure analysis on a semiconductor device, for example, the FIB processing can be easily stopped at a specific cross section.

Japanese Patent Application No. 2005-108545 (PTL 1) discloses that a photoelectron microscope combining an electron microscope and an X-ray photoelectron spectroscopy, which acquires a photoelectron with specific energy and acquires information on a bonding state, or a secondary ion/electron microscope using an excited secondary ion as a source of image encoding eliminates a spherical aberration by a method of using a color aberration in an image forming optical system by wavelength modulation of radiated light and changing (modulating) a focus position of the system at high speed, a method of changing (modulating) a lens system at high speed, and a method of changing (modulating) a sample position at high speed.

Moreover, Japanese Patent Application No. 58-158848 (PTL 2) discloses an electron detector capable of detecting a secondary electron and a reflected electron simultaneously by including a light guide, two layers of scintillators formed on an electron incident surface of the light guide and formed of materials having different emission spectra, spectroscopic means installed on the emission side of the light guide to separate light from each scintillator, and photoelectricity detection means that detects each light being separated.

Moreover, Japanese Patent Application No. 9-161712 (PTL 3) discloses an observation apparatus that processes a sample with an ion beam, the apparatus including means that selects and detects a reflected electron acquired by irradiating the sample with an electron beam. It is described in PTL 3 that while a secondary electron generated by the ion beam irradiation cannot be distinguished from a secondary electron generated by the electron beam irradiation, the reflected electron returning by the action of elastic scattering of the electron beam has higher energy than the secondary electron and can thus be distinguished from the secondary electron in terms of the energy difference, whereby one can observe how the sample changes in shape without suspending the ion beam processing in the middle thereof.

CITATION LIST

Patent Literature

PTL 1: Japanese Patent Application No. 2005-108545
PTL 2: Japanese Patent Application No. 58-158848
PTL 3: Japanese Patent Application No. 9-161712

SUMMARY OF INVENTION

Technical Problem

However, the FIB processing and the SEM observation are usually performed separately. The inventors of the present application believe this happens because it is difficult to separate charged particles of the same kind such as the secondary electron emitted from the sample by the ion beam irradiation and the secondary electron emitted from the sample by the electron beam irradiation.

An object of the present invention relates to extraction of a signal arising from a certain charged particle beam when the sample is irradiated with a plurality of charged particle beams simultaneously. The object for example relates to separation between a secondary electronic signal arising from the ion beam irradiation and a secondary electronic signal arising from the electron beam irradiation in the FIB-SEM system.

Solution to Problem

The present invention relates to modulating an irradiation condition of the charged particle beam at high speed and detecting a signal in synchronization with a modulation period.

The present invention further relates to dispersing light emitted from two or more kinds of scintillators having different light emitting properties, detecting each signal strength, and processing a signal on the basis of a ratio of first signal strength when a sample is irradiated with a first charged particle beam alone to second signal strength when the sample is irradiated with a second charged particle beam alone, the ratio being set by a mechanism.

Advantageous Effects of Invention

The present invention enables extraction of only a signal arising from a desired charged particle beam when the sample is irradiated with the plurality of charged particle beams simultaneously. The SEM observation can be performed in the middle of the FIB processing using the secondary electron in the FIB-SEM system, for example.

DESCRIPTION OF EMBODIMENTS

An embodiment discloses a composite charged particle beam apparatus including: a first charged particle beam column which irradiates a sample with a first charged particle beam; a second charged particle beam column which irradiates the sample with a second charged particle beam; a charged particle detector which detects a charged particle emitted from the sample; an image display mechanism which outputs an image on the basis of a signal from the charged particle detector; a modulation mechanism which modulates an irradiation condition of the first charged particle beam with a period shorter than a scan period of the first charged particle beam; a controller which controls a modulation period modulated by the modulation mechanism; and a detection mechanism which detects a signal in synchronization with the modulation period, where a signal arising from the first charged particle beam is detected separately from a signal arising from the second charged particle beam by detecting the signal in synchronization with the modulation period.

An embodiment further discloses a charged particle beam apparatus including: a charged particle beam column which irradiates a sample with a charged particle beam; a detector which detects a charged particle emitted from the sample; a modulation mechanism which modulates an irradiation condition of the charged particle beam with a period shorter than a scan period of the charged particle beam; a controller which controls the modulation period modulated by the modulation mechanism; and a detection mechanism which detects a signal in synchronization with the modulation period.

The embodiment further includes, as the modulation mechanism, a mechanism which performs blanking of the charged particle beam.

The embodiment further includes, as the modulation mechanism, a mechanism which modulates an irradiation current of the charged particle beam with a period shorter than the scan period of the first charged particle beam. There is also included a controller or a GUI screen with which a modulation width and period of the irradiation current are controlled.

The embodiment further includes, as the modulation mechanism, a mechanism which modulates irradiation energy of the charged particle beam with a period shorter than the scan period of the first charged particle beam. There is also included a controller or a GUI screen with which an irradiation energy width and period of the modulated charged particle beam are controlled.

The embodiment further includes a lens which focuses the charged particle beam on the sample, where a focus position of the lens is changed in synchronization with the modulation period.

The embodiment further includes a sample stage on which the sample is mounted, where a position of the sample stage is changed in synchronization with the modulation period.

The embodiment further includes a button on a control panel or a GUI screen, the button being used to execute a function that automatically searches for the modulation period.

The embodiment further discloses that a function of automatically searching for the modulation period is executed upon performing a predetermined mouse operation on a specific region of the GUI screen.

The embodiment also includes a controller or a GUI screen with which a period of blanking the charged particle beam is controlled.

The embodiment further includes a GUI screen on which a waveform of the modulation period is selected.

The embodiment further includes a GUI screen on which the modulation period is set on the basis of the scan period of the charged particle beam radiated onto the sample.

The embodiment further discloses that a schematic view representing the shape of the waveform of the modulation period is displayed on the GUI screen.

An embodiment further discloses a composite charged particle beam apparatus including: a first charged particle beam column which irradiates a sample with a first charged particle beam; a second charged particle beam column which irradiates the sample with a second charged particle beam; a charged particle detector which detects a charged particle emitted from the sample; an image display mechanism which outputs an image on the basis of a signal from the charged particle detector; a mechanism which sets a ratio of first signal strength when the sample is irradiated with the first charged particle beam alone; a mechanism which sets a ratio of second signal strength when the sample is irradiated with the second charged particle beam alone; and a computing unit which processes the signal from the detector on the basis of the ratio of the first and second signal strength, where the charged particle detector includes: a charged particle light receiving surface which has two or more kinds of scintillators with different light emitting properties; a mechanism which applies voltage to the charged particle light receiving surface; a spectroscopic mechanism which disperses light emitted from the scintillators; and a detection mechanism which detects each signal strength after dispersion.

The embodiment further discloses that a composite scintillator formed by mixing two or more kinds of fluorescent particles with different light emitting properties is used for the charged particle light receiving surface.

The embodiment further discloses that the computing unit is used to calculate signal strength arising from the first charged particle beam when the sample is irradiated with the first charged particle beam and the second charged particle beam simultaneously, and display an image.

The embodiment further discloses that a ratio of each signal strength is acquired from the each signal strength after dispersion.

The embodiment further discloses that a region for which a ratio of the signal strength is to be calculated is specified on a GUI screen, and the ratio of the each signal strength is acquired in the specified region.

The embodiment further includes a function which automatically sets the voltage applied to the light receiving surface on the basis of an amount of change in the ratio of the signal strength.

The embodiment further includes a button on a control panel or a GUI screen, the button being used to execute a function that automatically sets the voltage applied to the light receiving surface.

The embodiment further discloses that a function of automatically setting the voltage applied to the light receiving surface is executed upon performing a predetermined mouse operation on a specific region of the GUI screen.

The embodiment further discloses that the ratio of the signal strength acquired is displayed on the GUI screen.

An embodiment further discloses a charged particle detector including: a charged particle light receiving surface which has two or more kinds of scintillators with different light emitting properties; a mechanism which applies voltage to the charged particle light receiving surface; a spectroscopic mechanism which disperses light emitted from the scintillators; a detection mechanism which detects each signal strength after dispersion; a variable amplifier which individually amplifies each signal strength; an amplification factor input mechanism which sets each amplification factor; a subtractor which finds a difference in the signal strength after amplification; and a signal output mechanism which outputs a signal after subtraction. The embodiment further discloses that a composite scintillator formed by mixing two or more kinds of fluorescent particles with different light emitting properties is used on the charged particle light receiving surface.

The aforementioned and other novel features and effects of the present invention will be described below with reference to the drawings. Note that the drawings are used exclusively for understanding of the invention and not intended to limit the scope of rights.

First Embodiment

Figure 1:
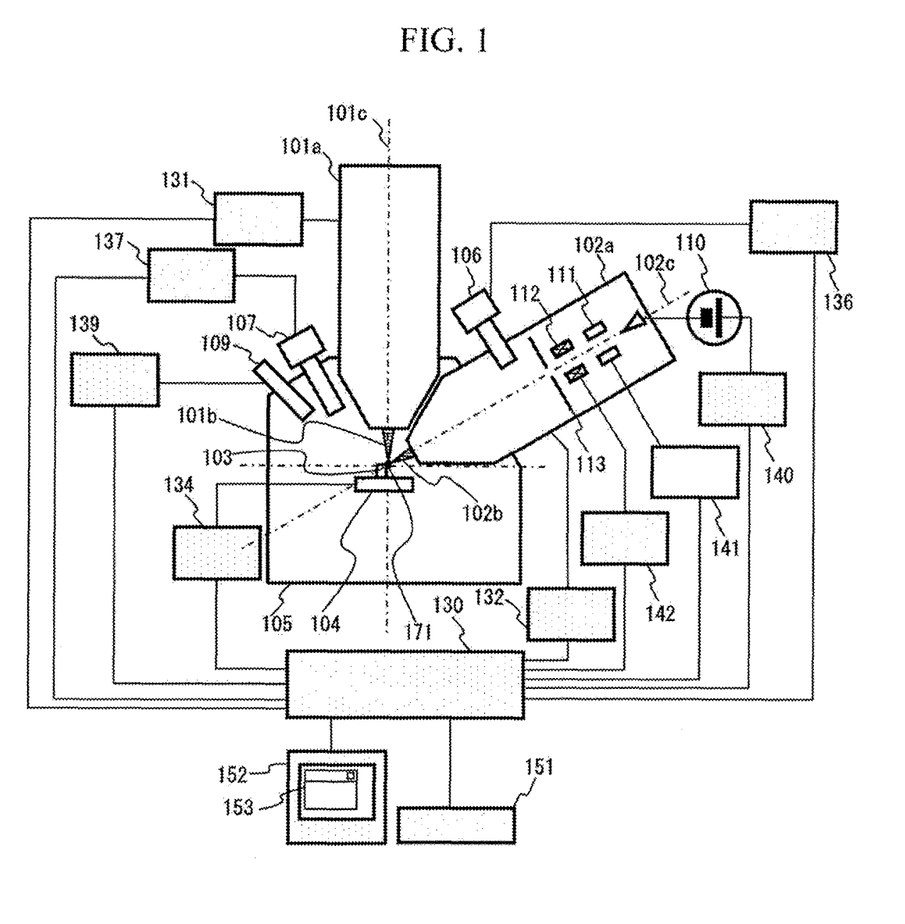
FIG. 1 is a schematic view of a charged particle beam apparatus according to a first embodiment.

FIG. 1 is a schematic view of a charged particle beam apparatus according to the present embodiment. As illustrated in FIG. 1, the charged particle beam apparatus includes an ion beam column 101a, an ion beam column controller 131 which controls the ion beam column 101a, an electron beam column 102a, an electron beam column controller 132 which controls the electron beam column 102a, a sample stage 104 on which a sample 103 can be mounted, a sample stage controller 134 which controls the sample stage 104, a sample chamber 105 in which the sample stage 104 is disposed, charged particle detectors 106 and 107 which detect a charged particle generated when the sample 103 is irradiated with an electron beam 102b or an ion beam 101b, detector controllers 136 and 137 which control the charged particle detectors 106 and 107, respectively, an X-ray detector 109, an X-ray detector controller 139 which controls the X-ray detector, an integrated computer 130 which controls an operation of the entire charged particle beam apparatus, a controller (such as a keyboard or a mouse) 151 with which an operator inputs various instructions such as an irradiation condition and a position of the sample stage, and one or a plurality of displays 152. The display 152 displays a GUI screen 153 used to control the apparatus, a state of the apparatus, a piece of information acquired (including an image), and the like. The state of the apparatus and the information acquired may be included in the GUI screen 153.

The ion beam column 101a is a system including all components required for an FIB, the components including an ion source which generates an ion beam, a lens which converges the ion beam, and a deflection system which scans and shifts the ion beam. The electron beam column 102a includes components required for an SEM such as an electron source which generates an electron beam, a lens which converges the electron beam, and a deflection system which scans and shifts the electron beam as well as an irradiation energy modulation power source 110 which can modulate the irradiation energy of the electron beam at high speed, an irradiation energy modulation power source controller 140 which controls the irradiation energy modulation power source, a blanking deflector 111 which can perform blanking of the electron beam at high speed, a blanking controller 141 which controls the blanking deflector 111, a current control lens 112 which modulates the current amount of the electron beam at high speed, a lens controller 142 which controls the current control lens, and a current control aperture 113. The irradiation energy modulation power source controller 140, the blanking controller 141 and the lens controller 142 may be included in the electron beam column controller 132. Note that the current amount is modulated when the current control lens controls the amount of electron passing through the current control aperture 113. The current control lens may also be a magnetic field lens or an electrostatic lens.

The ion beam column 101a and the electron beam column 102a are mounted in the sample chamber 105, and the ion beam 101b passing the ion beam column 101a and the electron beam 102b passing the electron beam column 102a are mainly focused on an intersection point (cross point 171) of an optical axis 101c of the ion beam column and an optical axis 102c of the electron beam column. While a gallium ion is generally used as the ion beam 101b, an ion species does not matter in processing. Moreover, the ion beam is not limited to a focused ion beam but may be a broad ion beam.

While the ion beam column 101a is disposed vertically and the electron beam column 102a at an angle in the present embodiment, the ion beam column 101a may instead be disposed at an angle and the electron beam column 102a vertically. Moreover, the ion beam column 101a and the electron beam column 102a may both be disposed at an angle. It may also be adapted to have a triple column configuration including a gallium focused ion beam column, an argon focused ion beam column, and the electron beam column.

The sample stage 104 is capable of plane movement and rotational movement. The stage can also move a spot requiring ion beam processing or observation to a position of ion beam irradiation or to an observation position corresponding to the electron beam.

Each of the detector controllers 136 and 137 includes a circuit or arithmetic processing unit which performs arithmetic processing on a detection signal and converts it to an image. Note that a composite charged particle detector capable of detecting not only an electron but an ion may be used as each of the charged particle detectors 106 and 107.

In addition to the aforementioned units, the sample chamber 105 includes a gas deposition unit which is used in overcoat fabrication and marking and a microsampling unit which picks up a specific spot in the sample. Drive mechanisms such as the deposition unit and the microsampling unit each have a controller. The gas deposition unit used in the overcoat fabrication and marking stores a deposition gas which forms a deposition film by irradiation of a charged particle beam and can supply the gas from a nozzle tip as needed. The microsampling unit which picks up the specific spot in the sample in combination with processing and cutting of the sample by the FIB includes a probe that can move within the sample chamber 105 by a probe driving unit. The probe is used to extract a minute sample piece formed in the sample or supply an electric potential to the sample while brought into contact with the surface of the sample. The sample chamber 105 may also include a cold trap and an optical microscope. The sample chamber 105 may also include, as a detector other than the charged particle detector 107, a tertiary electron detector, a STEM detector, a backscattered electron detector, and a low energy loss electron detector. A mass spectrometer or the like may also be mounted in addition to the X-ray detector 109. The integrated computer 130 and each controller can communicate with each other.

A technical effect of applying modulation to the charged particle beam will be described.

Figure 2A:
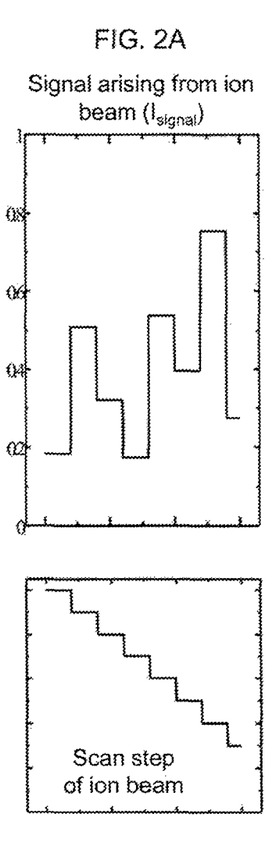
FIGS. 2A-2C are diagrams illustrating an example of signal detection when an irradiation condition is not modulated.
Figure 2B:
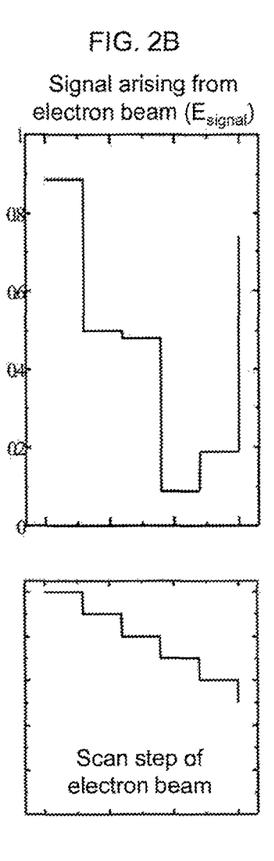
Figure 2C:
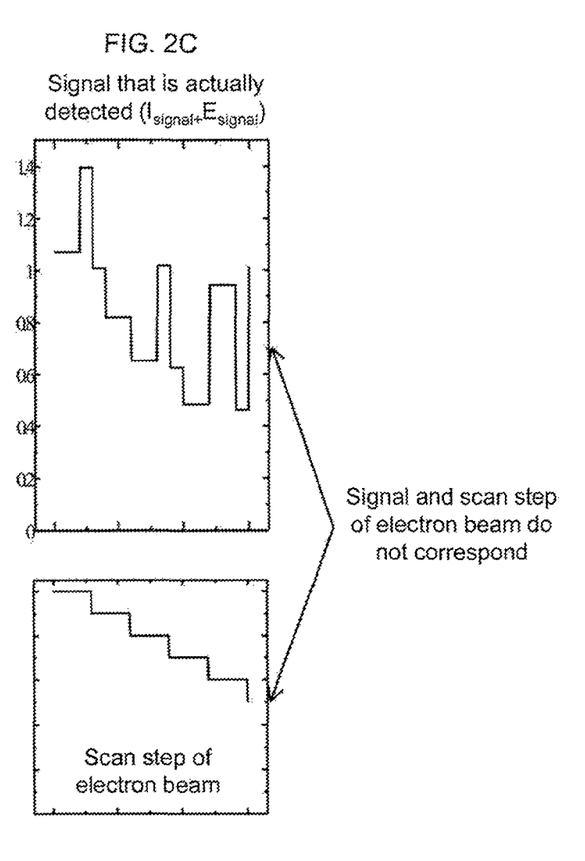
Figure 3A:
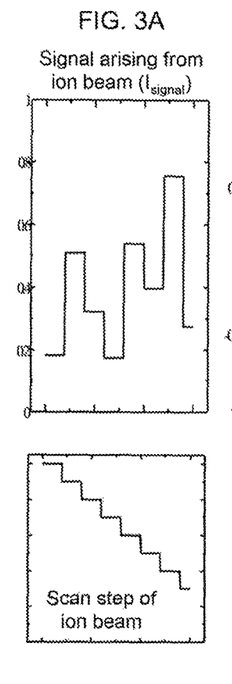
FIGS. 3A-3D are diagrams illustrating an example of signal detection when the irradiation condition is modulated.
Figure 3B:
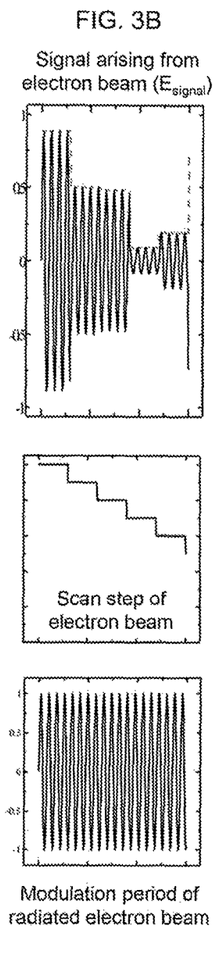
Figure 3C:
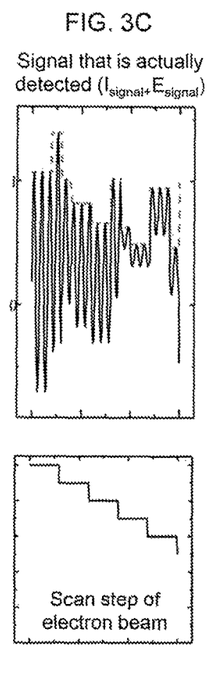
Figure 3D:
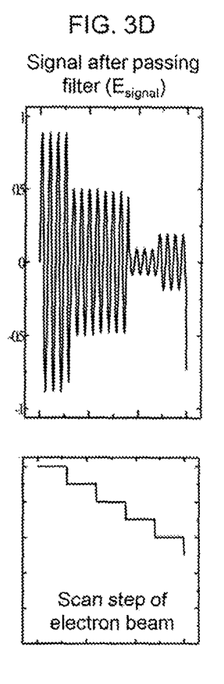

When the irradiation current of the electron beam is modulated, the amount of charged particle emitted from the sample is modulated with the same period as well. Accordingly, when the irradiation current is modulated with a period sufficiently shorter than a scan period of the electron beam and ion beam, an amplitude of signal strength changing with a period identical to the modulation period of the irradiation current is detected to be able to extract only a signal arising from the electron beam. This point will be described with reference to FIGS. 2(*a*) to 2(*c*) and 3(*a*) to 3(*d*). FIGS. 2(*a*) to 2(*c*) are diagrams illustrating an example of signal detection when the electron beam and the ion beam are not modulated. A lower tier of FIG. 2(*a*) represents a scan step of the ion beam where one step corresponds to one pixel. An upper tier of FIG. 2(*a*) represents a signal arising from the ion beam, where the signal strength changes at a timing when an irradiation position on the sample is moved, or a timing when the scan step in the lower tier is changed. On the other hand, a lower tier of FIG. 2(*b*) represents a scan step of the electron beam where one step corresponds to one pixel. An upper tier of FIG. 2(*b*) represents a signal arising from the electron beam, where the signal strength changes at a timing when the scan step in the lower tier is changed. When the charged particle beam of either the ion beam or the electron beam is radiated as illustrated in FIGS. 2(*a*) and 2(*b*), a scan image can be obtained with no problem as the scan step corresponds to the signal strength. When the ion beam and the electron beam are radiated simultaneously, however, the sum of the upper tiers of FIGS. 2(*a*) and 2(*b*) is detected as the signal strength. An upper tier of FIG. 2(*c*) represents a signal that is actually detected and equals the sum of the upper tiers of FIGS. 2(*a*) and 2(*b*). A lower tier of FIG. 2(*c*) illustrates the scan step of the electron beam to facilitate understanding. One can see from FIG. 2(*c*) that the signal strength is changed irrelevantly to the change in the scan step. This happens because the signal arising from the ion beam is mixed with the signal arising from the electron beam, where it is impossible to extract only the signal arising from the electron beam from this signal waveform alone. As a result, one obtains an SEM image bearing the signal arising from the ion beam as noise.

Now, FIGS. 3(*a*) to 3(*d*) illustrate an example of signal detection when modulation (sine wave) is applied to the current control lens, or when modulation (sine wave) is applied to the current amount of the electron beam.

Similar to FIG. 2(*a*), FIG. 3(*a*) represents the signal strength arising from the ion beam (upper tier) and the scan step of the ion beam (lower tier). FIG. 3(*b*) represents signal strength arising from the electron beam when the irradiation current of the electron beam is modulated (upper tier), a scan step of the electron beam (middle tier), and a modulation period (lower tier). In this case, the signal strength is represented by the multiplication of the signal strength and modulation period when the modulation is not applied. When the ion beam and the electron beam are radiated simultaneously, the sum of the upper tiers of FIGS. 3(*a*) and 3(*b*) is detected as the signal strength and represented as illustrated in an upper tier of FIG. 3(*c*). The signal strength is changed irrelevantly to the scan step of the electron beam in a state illustrated in the upper tier of FIG. 3(*c*), in which case one can only obtain a scanning electron beam image bearing the signal arising from the ion beam as noise, as is the case in FIG. 2(*c*). However, a signal waveform illustrated in an upper tier of FIG. 3(*d*) is obtained when passing a band-pass filter corresponding to the modulation period of the irradiated electron beam. The change in amplitude illustrated in the upper tier of FIG. 3(*d*) corresponds to the scan step of the electron beam illustrated in a lower tier of FIG. 3(*d*). This indicates that only the signal arising from the electron beam can be extracted even when the ion beam and the electron beam are radiated simultaneously. Accordingly, one can extract only a signal arising from a certain charged particle beam by applying modulation with a period shorter than the scan step to the charged particle beam, even when a plurality of charged particle beams is radiated simultaneously.

While a change in a focus position of an objective lens caused by the modulation of the current control lens is considered negligible in the present embodiment, the present method can be adapted more extensively by including a mechanism which corrects the change in the focus position. The focus position can be corrected by including a mechanism which modulates the objective lens with a period identical to the modulation period of the current control lens, or a mechanism which mechanically changes the position of an observation target, for example.

A similar effect can be attained by a method of applying modulation to the irradiation energy instead of applying modulation to the current control lens or a method of periodically blanking the electron beam. Moreover, one can obtain only the signal arising from the ion beam by finding a difference between all signal strength and extracted signal strength.

While the signal arising from the electron beam is extracted in the present embodiment, one can extract only the signal arising from the ion beam by applying modulation to the ion beam. Irrespective of the system including the electron beam column and the ion beam column, the present method is applicable to a general composite charged particle beam apparatus including two or more charged particle beam columns.

In radiating a single charged particle beam, an output not arising from the radiated charged particle beam, namely noise, can be removed by detecting only a signal that matches the modulation period of the radiated charged particle beam. The image quality can be improved as a result. Therefore, the present method is effective for a general charged particle beam apparatus.

Figure 4:
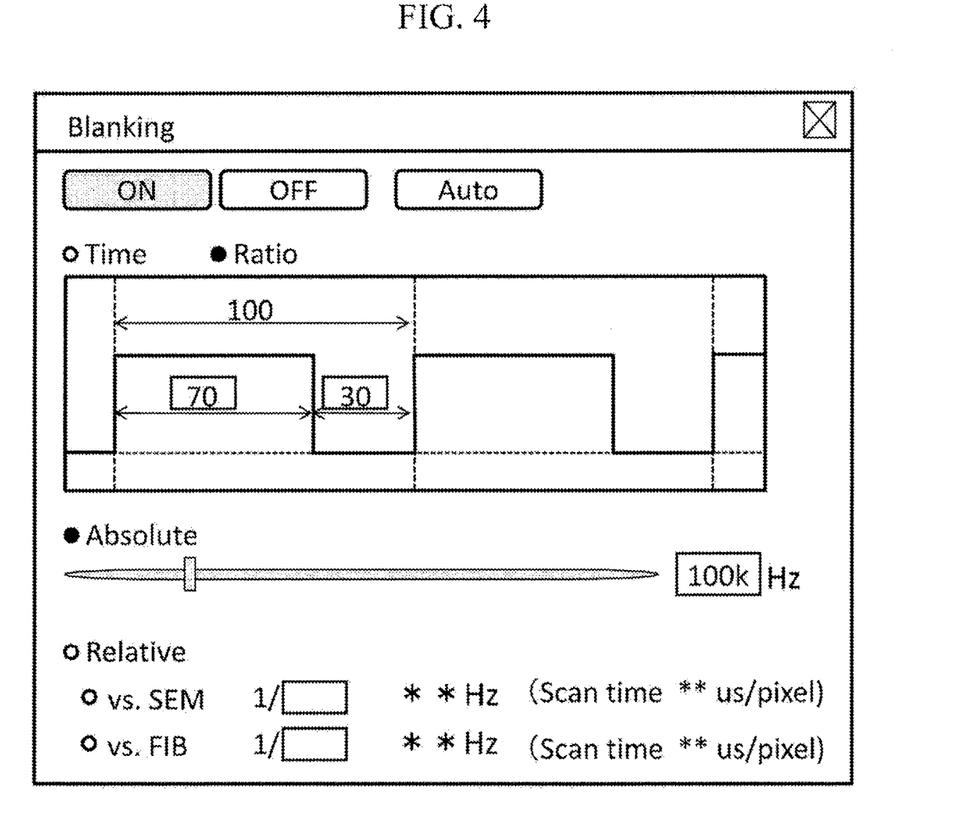
FIG. 4 is a diagram illustrating an example of a control screen according to the first embodiment.
Figure 5:
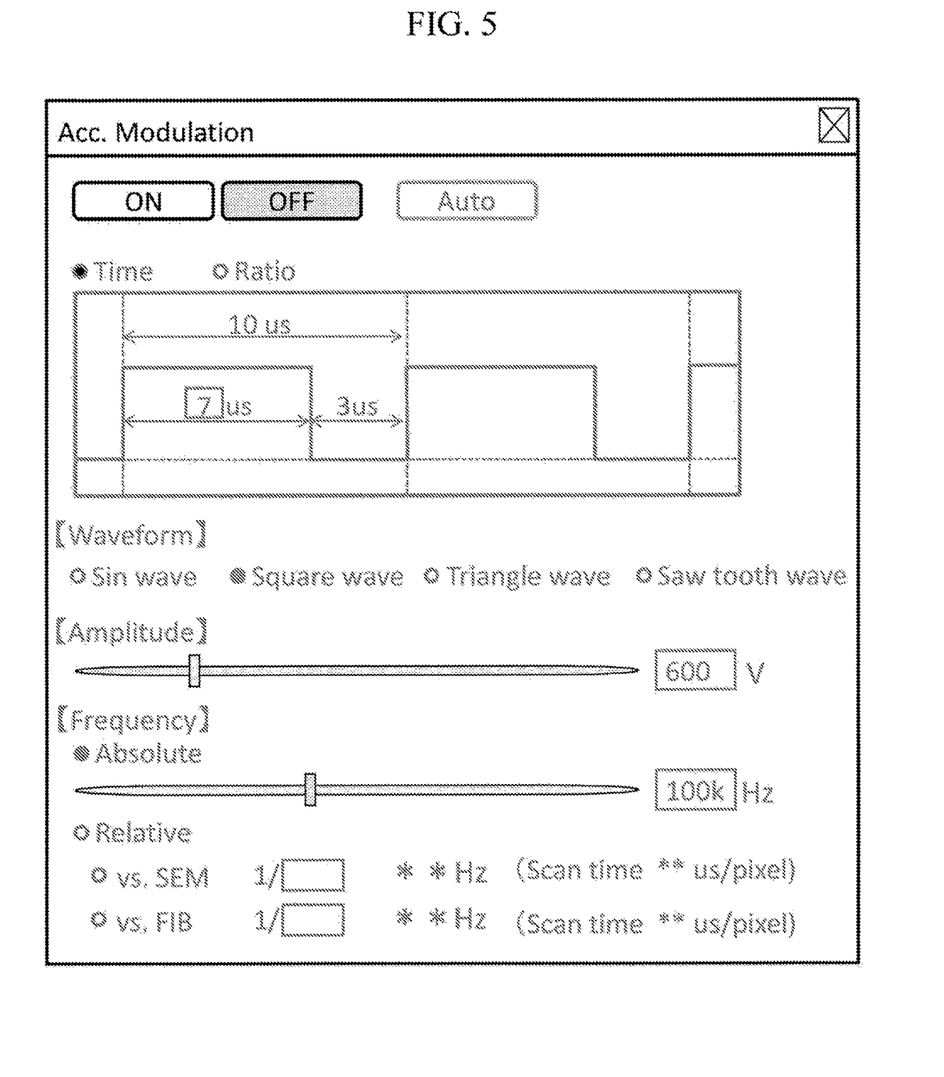
FIG. 5 is a diagram illustrating an example of the control screen according to the first embodiment.

FIGS. 4 and 5 are schematic views each illustrating a GUI screen according to the present embodiment. In executing the aforementioned procedure, it is convenient to have on the display 152 the GUI screen as illustrated in FIGS. 4 and 5 used to control the apparatus or a controller having an equivalent function. That is, it is convenient to be able to continuously change a blanking period, the modulation period and amplitude of the current control lens, and a modulation period and amplitude of an accelerating voltage with a slider or a controller on the GUI as one can set an appropriate condition while checking the change in the signal strength. On the other hand, it is convenient to be able to input a numerical value with a keyboard when one knows the appropriate condition in advance. Also effective is a method of setting the modulation period relatively to a scan speed of the SEM and a scan speed of the FIB. It is also intuitively easy to understand and user friendly when a modulated waveform being set is displayed on the GUI.

Moreover, it is convenient to have a function which determines an appropriate modulation period from an unnecessary signal amount included in an output image (the signal amount arising from the ion beam included in the SEM image, in the present embodiment) and automatically sets the modulation period. In addition to providing a button on the GUI, a method which assigns a specific mouse operation such as a double click on an image and a method which provides a short cut key are effective as a method of launching the present function.

Second Embodiment

Figure 6:
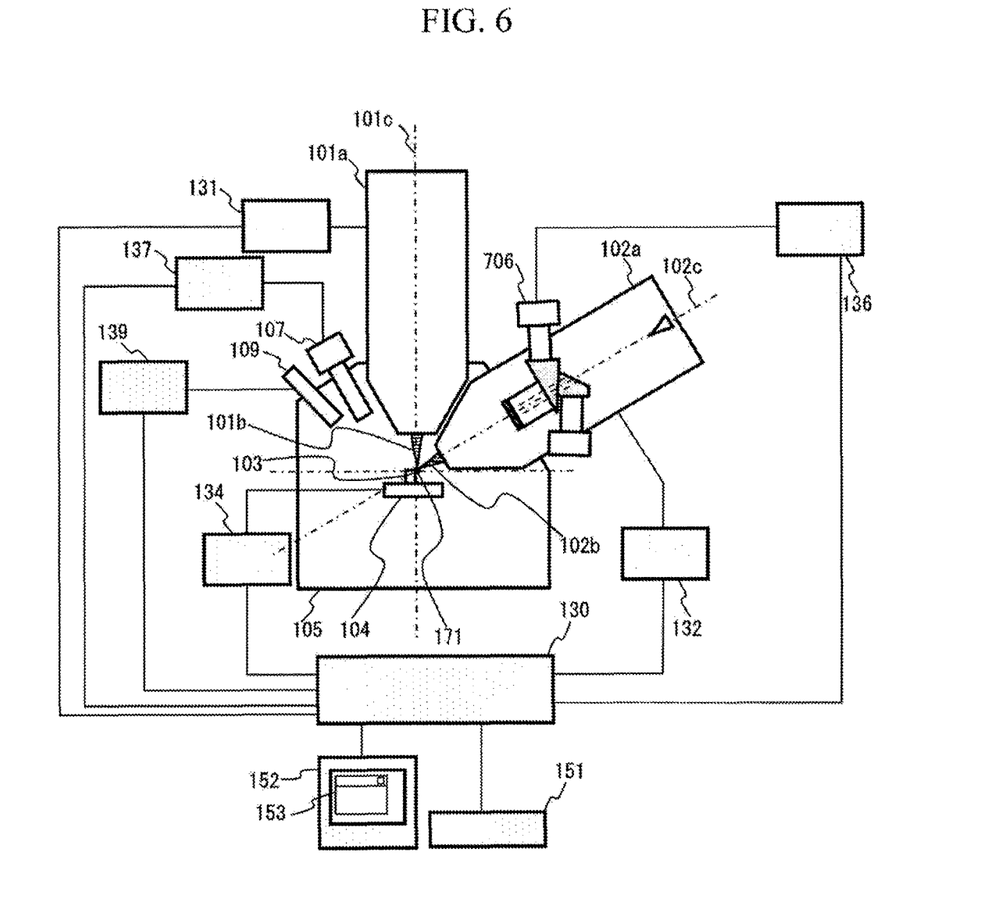
FIG. 6 is a schematic view of a composite charged particle beam apparatus according to a second embodiment.
Figure 7:
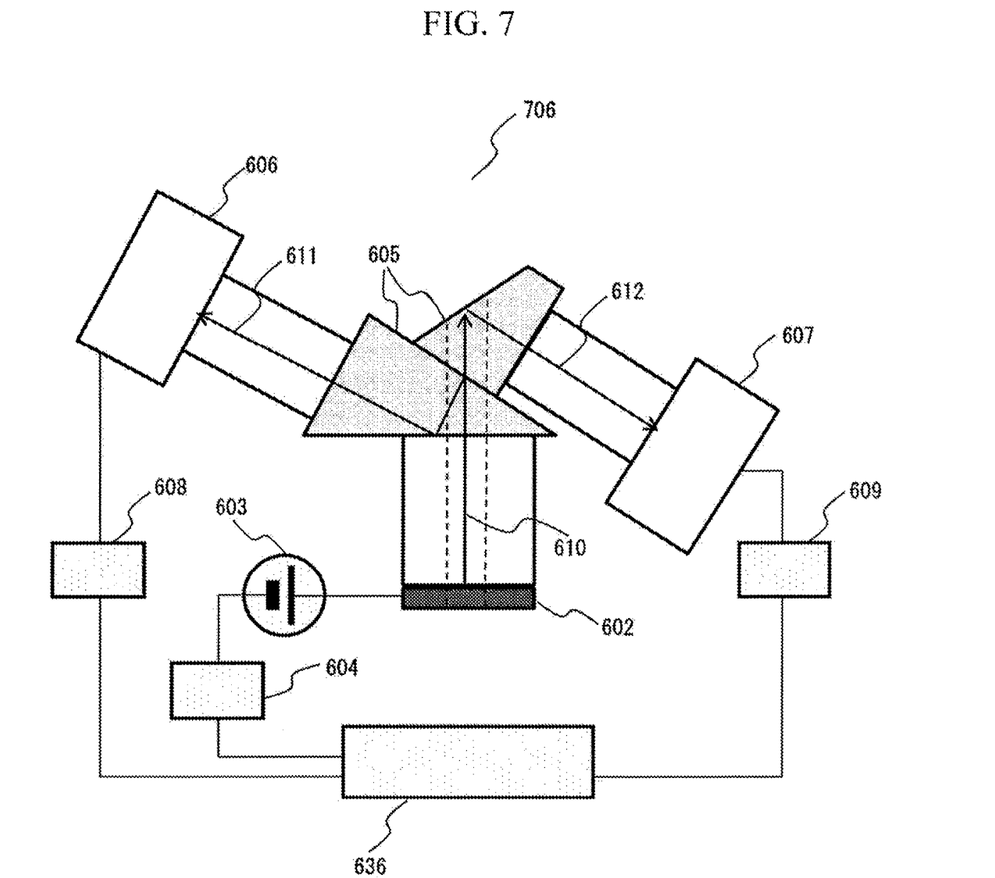
FIG. 7 is a schematic view of a spectroscopic function-equipped charged particle detector.

FIG. 6 is a schematic view of a composite charged particle beam apparatus according to the present embodiment. FIG. 7 is a schematic view of a spectroscopic function-equipped charged particle detector according to the present embodiment. The apparatus configuration of the present embodiment will now be described while focusing on what is different from the first embodiment.

The composite charged particle beam apparatus illustrated in FIG. 6 includes an ion beam column 101a, an ion beam column controller 131 which controls the ion beam column 101a, an electron beam column 102a, an electron beam column controller 132 which controls the electron beam column 102a, a sample stage 104 on which a sample 103 can be mounted, a sample stage controller 134 which controls the sample stage 104, a sample chamber 105 in which the sample stage 104 is disposed, a spectroscopic function-equipped charged particle detector 706 which detects a charged particle generated when the sample 103 is irradiated with an electron beam 102b or an ion beam 101b, a charged particle detector 107 which detects the charged particle generated when the sample 103 is irradiated with the electron beam 102b or the ion beam 101b, detector controllers 136 and 137 (the detector controller 136 may be identical to a detector controller 636 in FIG. 7 to be described) which control the spectroscopic function-equipped charged particle detector 706 and the charged particle detector 107, respectively, an X-ray detector 109, an X-ray detector controller 139 which controls the X-ray detector, an integrated computer 130 which controls an operation of the entire composite charged particle beam apparatus, a controller (such as a keyboard or a mouse) 151 with which an operator inputs various instructions such as an irradiation condition and a position of the sample stage, and one or a plurality of displays 152.

Each of the detector controllers 136 and 137 includes a circuit or arithmetic processing unit which performs arithmetic processing on a detection signal and converts it to an image. Note that a composite charged particle detector capable of detecting not only an electron but an ion may be used as each of the charged particle detectors 106 and 107. While the spectroscopic function-equipped charged particle detector 706 is mounted only to the electron beam column 102a in the present embodiment, the spectroscopic function-equipped charged particle detector 706 may be mounted only in the sample chamber 105 or both to the electron beam column 102a and in the sample chamber 105.

The sample chamber 105 may also include, as a detector other than the charged particle detector 107, a tertiary electron detector, a STEM detector, a backscattered electron detector, and a low energy loss electron detector. A mass spectrometer or the like may also be mounted in addition to the X-ray detector 109.

The spectroscopic function-equipped charged particle detector 706 illustrated in FIG. 7 includes a charged particle light receiving surface 602 formed by mixing two or more kinds of scintillators, a light receiving surface power source 603 which applies voltage to the charged particle light receiving surface 602, a light receiving surface power source controller 604 which controls the light receiving surface power source, a spectroscope 605 which disperses a light beam 610 emitted from the scintillator, first and second photodetectors 606 and 607 which detect dispersed light beams 611 and 612, respectively, first and second photodetector controllers 608 and 609 which control the first and second photodetectors, respectively, and the detector controller 636 which has control over the light receiving surface power source controller 604 and the photodetector controllers 608 and 609. While one spectroscope and two photodetectors are mounted in the present embodiment, any number of spectroscopes and photodetectors may be provided for the purpose of detecting the dispersed light. A single imaging element with a spectroscopic function may be used as well.

A technical effect of signal processing using a ratio of signal strength will be described.

An energy distribution of the charged particle emitted from the sample depends on the kind and energy of the charged particle beam radiated. Therefore, when the charged particle light receiving surface is formed of two or more kinds of scintillators with different light emitting properties, the intensity of light emitted from each scintillator depends on a sample irradiation condition of the charged particle, a voltage applied to the charged particle light receiving surface, and shape and composition of the sample. Here, charged particles generated by the same process among the charged particles emitted from the sample are expected to be generated with the same ratio without depending on the shape and composition of the sample.

Accordingly, one can extract only a signal arising from a desired charged particle beam (only a signal arising from the electron beam in this case) by the following procedure even when the sample is irradiated with two or more kinds of charged particle beams (the electron beam and the ion beam in this case). This point will be described with reference to FIGS. 8(a) to 8(d) illustrating an example of signal detection performed by the spectroscopic function-equipped charged particle detector.

(1) Adjust voltage applied to the charged particle light receiving surface such that a ratio of signal strength obtained by the first photodetector to signal strength obtained by the second photodetector is always the same when the sample is irradiated with the ion beam. Here, $I_1$ and $I_2$ indicate the signal strength arising from the ion beam and obtained by the first and second photodetectors, respectively (FIG. 8(a)).

Figure 8A:
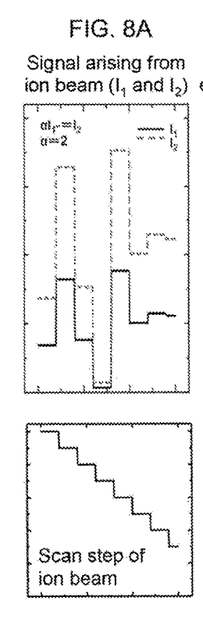
FIGS. 8A-8D are diagrams illustrating an example of signal detection performed by a spectroscopic function-equipped charged particle detector.
Figure 8B:
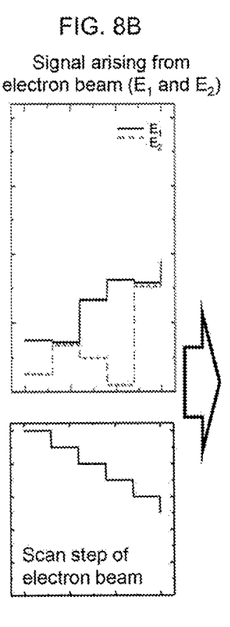

(2) Calculate a ratio $\alpha$ ($=I_2/I_1$) of the signal strength in the case of (1).

(3) Irradiate the sample with the electron beam. Here, $E_1$ and $E_2$ indicate the signal strength arising from the electron beam and obtained by the first and second photodetectors, respectively (FIG. 8(b)).

(4) Irradiate the sample with the ion beam and the electron beam simultaneously.

Figure 8C:
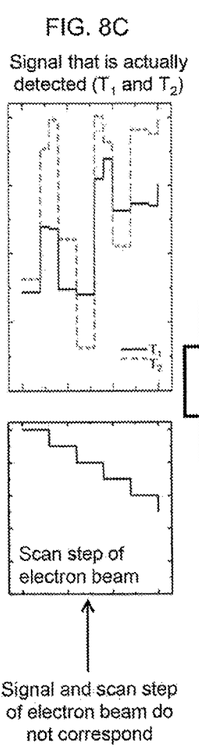

(5) Signals $T_1$ and $T_2$ detected by the first and second photodetectors when the sample is irradiated with the ion beam and the electron beam equal the following (FIG. 8(c)).

The signal detected by the first photodetector:
$$T_1 = E_1 + I_1$$

The signal detected by the second photodetector:
$$T_2 = E_2 + I_2 = E_2 + \alpha I_1$$

Figure 8D:
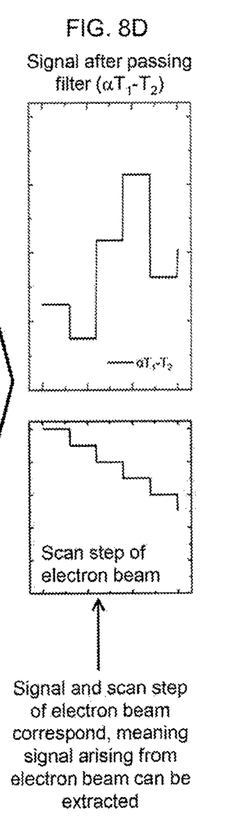

(6) Multiply the signal $T_1$ detected by the first photodetector by $\alpha$ and then subtract from the product the signal $T_2$ detected by the second photodetector. The output equals the following (FIG. 8(d)).

$$\text{An output signal:} S_{output} = \alpha T_1 - T_2 = (\alpha E_1 + \alpha I_1) - (E_2 + \alpha I_1) = \alpha E_1 - E_2$$

(7) One can see that the signal strength in (6) is represented with $E_1$ and $E_2$ and that the signal depends only on the electron beam. Therefore, the SEM image can be acquired from the signal strength in (6) and the scan period of the electron beam.

While only the ratio $\alpha$ of the signal strength arising from the ion beam is fixed in the present embodiment, a signal arising from the ion beam can also be extracted when a ratio $\beta$ of the signal strength arising from the electron beam is fixed. In that case, it is required that $\alpha \ne \beta$.

Note that while the present embodiment aims to extract the signal arising from the electron beam in radiating the ion beam and the electron beam simultaneously, the number and kind of charged particle beam radiated onto the sample do not matter when it is aimed to extract only a signal arising from a desired charged particle beam.

Figure 9:
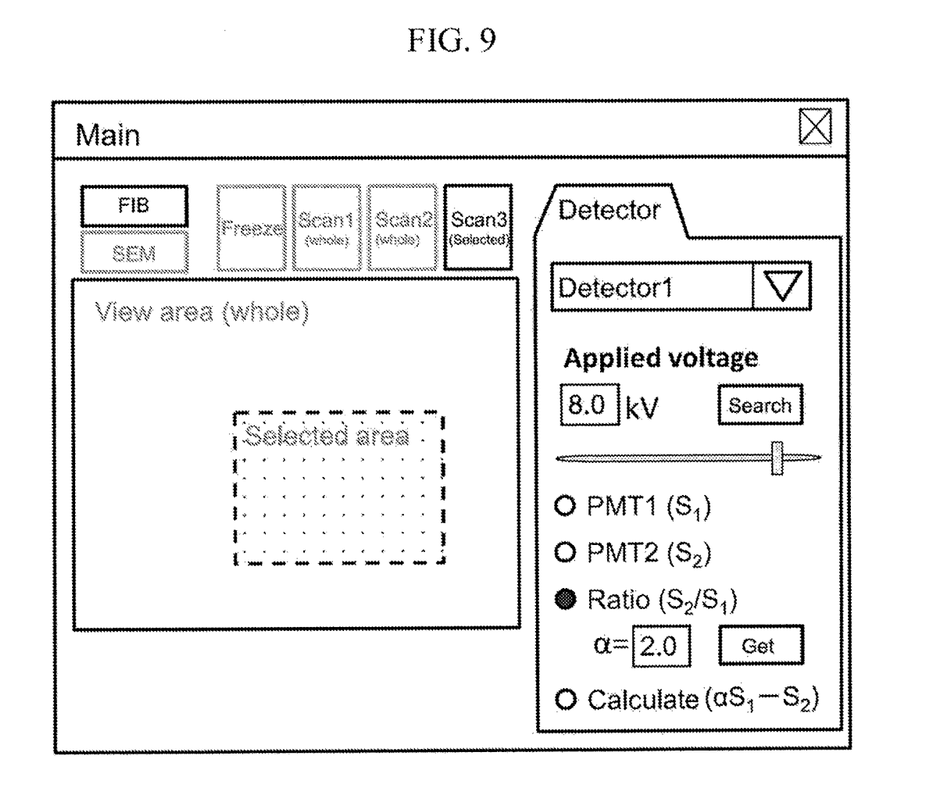
FIG. 9 is a diagram illustrating an example of a control screen according to the second embodiment.

FIG. 9 is a schematic view of a GUI screen according to the present embodiment. In executing the aforementioned procedure, it is convenient to have on the display 152 the GUI screen as illustrated in FIG. 9 to control the apparatus or a controller having an equivalent function. That is, it is convenient to have a function ("View area" in FIG. 9) which displays a scan image according to the ratio of the signal strength detected by the first and second photodetectors and a function (a "Get" button in FIG. 9) which displays an average value of the ratio. It is further convenient to be able to specify a desired area on the pictured scan image ("Selected area" in FIG. 9) and calculate an average value of a ratio of signal strength in that area as this eliminates the need for radiating an unnecessary charged particle beam.

Concerning the setting of the voltage applied to the charged particle light receiving surface described in procedure (1), it is convenient to have a function (a "Search" button in FIG. 9) which, with a push of a button, searches for a voltage condition of the charged particle light receiving surface with the smallest change in the ratio. In addition to providing the button on the GUI, a method which assigns a specific mouse operation such as a double click on an image and a method which provides a short cut key are effective as a method of launching the present function.

A technical effect of using a mixed scintillator will be described.

PTL 2 discloses a structure in which two layers of scintillators with different light emitting properties are stacked. This structure needs to be fabricated by performing a stacking process such as deposition and application twice in order to stack the different scintillators and, in the second process, one needs to be careful about not causing the scintillator already deposited or applied in the first process to be resurfaced or exfoliated. When using the mixed scintillator, however, fluorescent particles with different light emitting properties are mixed in advance so that the structure can be fabricated with ease by a process similar to a normal fabrication process. It is thus superior to what is described in PTL 2 in terms of this point.

REFERENCE SIGNS LIST 101a ion beam column
101b ion beam
101c optical axis of ion beam column
102a electron beam column
102b electron beam
102c optical axis of electron beam column
103 sample
104 sample stage
105 sample chamber
106, 107 charged particle detector
109 X-ray detector
110 irradiation energy modulation power source
111 blanking deflector
112 current control lens
113 current control aperture
130 integrated computer
131 ion beam column controller
132 electron beam column controller
134 sample stage controller
136, 137, 636 detector controller
139 X-ray detector controller
140 irradiation energy modulation power source controller
141 blanking controller
142 lens controller
151 controller (such as keyboard and mouse)
152 display
153 GUI screen
171 cross point
602 charged particle light receiving surface
603 light receiving surface power source
604 light receiving surface power source controller
605 spectroscope
606, 607 photodetector
608, 609 photodetector controller
610, 611, 612 light beam
706 spectroscopic function-equipped charged particle detector

The invention claimed is:

1. A composite charged particle beam apparatus comprising:
   a first charged particle beam column which irradiates a sample with a first charged particle beam;
   a second charged particle beam column which irradiates the sample with a second charged particle beam;
   a charged particle detector which detects a charged particle emitted from the sample;
   an image display mechanism which outputs an image on the basis of a signal from the charged particle detector;
   a mechanism which sets a ratio of a first signal strength when the sample is irradiated with the first charged particle beam alone to a second signal strength when the sample is irradiated with the second charged particle beam alone;
   a computing unit which processes the signal from the detector on the basis of the ratio of the first signal strength to the second signal strength,
   wherein the charged particle detector includes:
   a charged particle light receiving surface which has two or more kinds of scintillators with different light emitting properties;
   a mechanism which applies voltage to the charged particle light receiving surface;
   a spectroscopic mechanism which disperses light emitted from the scintillators; and a detection mechanism which detects each signal strength after dispersion.

2. The composite charged particle beam apparatus according to claim 1, wherein a composite scintillator formed by mixing two or more kinds of fluorescent particles with different light emitting properties is used for the charged particle light receiving surface.

3. The composite charged particle beam apparatus according to claim 1, wherein the computing unit is used to calculate signal strength arising from the first charged particle beam when the sample is irradiated with the first charged particle beam and the second charged particle beam simultaneously, and display an image.

4. The composite charged particle beam apparatus according to claim 1, wherein a ratio of each signal strength is acquired from the each signal strength after dispersion.

5. The composite charged particle beam apparatus according to claim 4, wherein the ratio of the signal strength is acquired on a GUI screen.

6. The composite charged particle beam apparatus according to claim 4, further comprising a function which automatically sets the voltage applied to the light receiving surface on the basis of an amount of change in the ratio of the signal strength.

7. The composite charged particle beam apparatus according to claim 6, further comprising a button on a control panel or a GUI screen, the button being used to execute a function which automatically sets the voltage applied to the light receiving surface.

8. The composite charged particle beam apparatus according to claim 6, wherein a function of automatically setting the voltage applied to the light receiving surface is executed upon performing a predetermined mouse operation on a specific region of a GUI screen.

9. The composite charged particle beam apparatus according to claim 4, wherein the ratio of the signal strength acquired is displayed on a GUI screen.

\* \* \* \* \*